United States Patent
Denoyer et al.

(10) Patent No.: US 11,886,023 B2
(45) Date of Patent: Jan. 30, 2024

(54) PHOTONIC OPTOELECTRONIC MODULE PACKAGING

(71) Applicant: FINISAR CORPORATION, Sunnyvale, CA (US)

(72) Inventors: Gilles P. Denoyer, San Jose, CA (US); Daniel Mahgerefteh, Los Angeles, CA (US); Vipul Bhatt, Sunnyvale, CA (US); Shiyun Lin, San Diego, CA (US); Brian Kim, Sunnyvale, CA (US)

(73) Assignee: II-VI DELAWARE, INC., Wilmington, DE (US)

( * ) Notice: Subject to any disclaimer, the term of this patent is extended or adjusted under 35 U.S.C. 154(b) by 484 days.

(21) Appl. No.: 16/993,587

(22) Filed: Aug. 14, 2020

(65) Prior Publication Data

US 2021/0048587 A1 Feb. 18, 2021

Related U.S. Application Data

(60) Provisional application No. 62/887,349, filed on Aug. 15, 2019.

(51) Int. Cl.
*G02B 6/42* (2006.01)
*H01L 23/498* (2006.01)
*H01L 23/00* (2006.01)

(52) U.S. Cl.
CPC .......... *G02B 6/423* (2013.01); *G02B 6/4202* (2013.01); *G02B 6/4249* (2013.01); *H01L 23/49844* (2013.01); *H01L 24/81* (2013.01)

(58) Field of Classification Search
CPC .... G02B 6/423; G02B 6/4207; G02B 6/4249; H01L 23/49844; H01L 24/81
See application file for complete search history.

(56) References Cited

U.S. PATENT DOCUMENTS

| | | | | |
|---|---|---|---|---|
| 5,257,334 A * | 10/1993 | Takahashi | ............ | G02B 6/3822 385/83 |
| 7,394,665 B2 * | 7/2008 | Hamasaki | ............ | H05K 7/1092 361/767 |
| 7,729,581 B2 * | 6/2010 | Rolston | ................ | G02B 6/4232 385/52 |
| 8,977,088 B2 * | 3/2015 | Castagna | ............. | G02B 6/4224 385/52 |
| 9,405,066 B2 * | 8/2016 | Mahgerefteh | ........ | G02B 6/1223 |
| 9,581,776 B1 * | 2/2017 | Lee | ....... | G02B 6/4246 |
| 9,678,271 B2 * | 6/2017 | Thacker | ............... | G02B 6/4219 |
| 9,874,691 B2 * | 1/2018 | Mahgerefteh | .......... | G02B 6/126 |
| 10,001,599 B2 * | 6/2018 | Park | ....................... | G02B 6/274 |
| 10,069,566 B2 * | 9/2018 | Chang | .................. | G02B 6/4214 |
| 10,215,938 B2 * | 2/2019 | Chang | .................. | G02B 6/3885 |

(Continued)

OTHER PUBLICATIONS

"Possum Die Design as a Low Cost 3D Packaging Alternative", Retrieved Aug. 10, 2020, from https://amkor.com/document-library/?looking_for=possum+die+design.

*Primary Examiner* — Peter Radkowski
(74) *Attorney, Agent, or Firm* — Blank Rome LLP

(57) ABSTRACT

In one example, an optoelectronic module may include a stack assembly including an electrical integrated circuit and an optical integrated circuit electrically and mechanically coupled to one another, an interposer electrically and mechanically coupled to the stack assembly, and an optical connector to optically couple the optical integrated circuit with an array of optical fibers.

21 Claims, 12 Drawing Sheets

(56) References Cited

U.S. PATENT DOCUMENTS

| | | | |
|---|---|---|---|
| 10,261,251 B2* | 4/2019 | Mahgerefteh | G02B 6/1228 |
| 10,656,333 B2* | 5/2020 | Mahgerefteh | G02B 6/126 |
| 10,684,419 B2* | 6/2020 | Fortusini | G02B 6/13 |
| 2002/0181058 A1* | 12/2002 | Ger | H04B 10/801 |
| | | | 398/164 |
| 2004/0218372 A1* | 11/2004 | Hamasaki | H05K 1/0263 |
| | | | 361/767 |
| 2007/0258683 A1* | 11/2007 | Rolston | G02B 6/4292 |
| | | | 385/88 |
| 2010/0215317 A1* | 8/2010 | Rolston | G02B 6/4292 |
| | | | 385/53 |
| 2016/0131837 A1* | 5/2016 | Mahgerefteh | G02B 6/124 |
| | | | 385/14 |
| 2016/0131842 A1* | 5/2016 | Mahgerefteh | G02B 6/136 |
| | | | 385/11 |
| 2016/0216445 A1* | 7/2016 | Thacker | G02B 6/4219 |
| 2016/0266332 A1* | 9/2016 | Fasano | G02B 6/4202 |
| 2017/0052317 A1* | 2/2017 | Mahgerefteh | G02B 6/274 |
| 2017/0126318 A1* | 5/2017 | Chang | G02B 6/4259 |
| 2017/0269316 A1* | 9/2017 | Chang | G02B 6/3885 |
| 2017/0363808 A1* | 12/2017 | Mahgerefteh | G02B 6/126 |
| 2018/0108642 A1* | 4/2018 | Sauter | H01L 25/50 |
| 2019/0170945 A1* | 6/2019 | Fortusini | G02B 6/13 |
| 2019/0243066 A1* | 8/2019 | Mahgerefteh | G02B 6/1223 |

* cited by examiner

PHOTONIC OPTOELECTRONIC MODULE PACKAGING

CROSS-REFERENCE TO RELATED APPLICATIONS

This application claims priority to and the benefit of U.S. Provisional Patent Application No. 62/887,349 filed Aug. 15, 2019, titled FLIP CHIP FACE TO FACE DIE-STACKED INTEGRATED SILICON PHOTONIC OPTO-ELECTRONIC MODULE PACKAGING, which is incorporated herein by reference in its entirety.

BACKGROUND

Unless otherwise indicated herein, the materials described herein are not prior art to the claims in the present application and are not admitted to be prior art by inclusion in this section.

The present disclosure generally relates to assembly and packaging configurations for optoelectronic modules.

Optoelectronic modules, such as transceivers, are increasingly used to transmit data between different devices or different locations. In particular, optical signals maybe used to rapidly communicate data (via the optical signals) between different devices or different locations. However, most electronic devices operate using electrical signals. Accordingly, optoelectronic modules may be used to convert optical signals to electrical signals and/or convert electrical signals to optical electrical, so optical signals may be used to transmit data between electronic devices. Optoelectronic modules may communicate with a host device by transmitting electrical signals to the host device and receiving electrical signals from the host device. These electrical signals may then be transmitted by the optoelectronic module as optical signals.

The subject matter claimed herein is not limited to implementations that solve any disadvantages or that operate only in environments such as those described above. Rather, this background is only provided to illustrate one example technology area where some implementations described herein may be practiced.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

The present disclosure generally relates to assembly and packaging configurations for optoelectronic modules.

In one non-limiting example, an optoelectronic module may include a stack assembly including an electrical integrated circuit and an optical integrated circuit electrically and mechanically coupled to one another, an interposer electrically and mechanically coupled to the stack assembly, and an optical connector to optically couple the optical integrated circuit with an array of optical fibers. The interposer may define a recess and the electrical integrated circuit of the stack assembly may be positioned at least partially within the recess.

In another example, a method may include face to face bonding an electrical integrated circuit and an optical integrated circuit to one another to form a stack assembly. The method may include flip-chip bonding the stack assembly to an interposer. The method may include optically coupling the optical integrated circuit with a fiber array via an optical connector. The method may include mechanically coupling the optical connector to the interposer.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features will become more fully apparent from the following description and appended claims, or may be learned by the practice as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION

Figure 1:
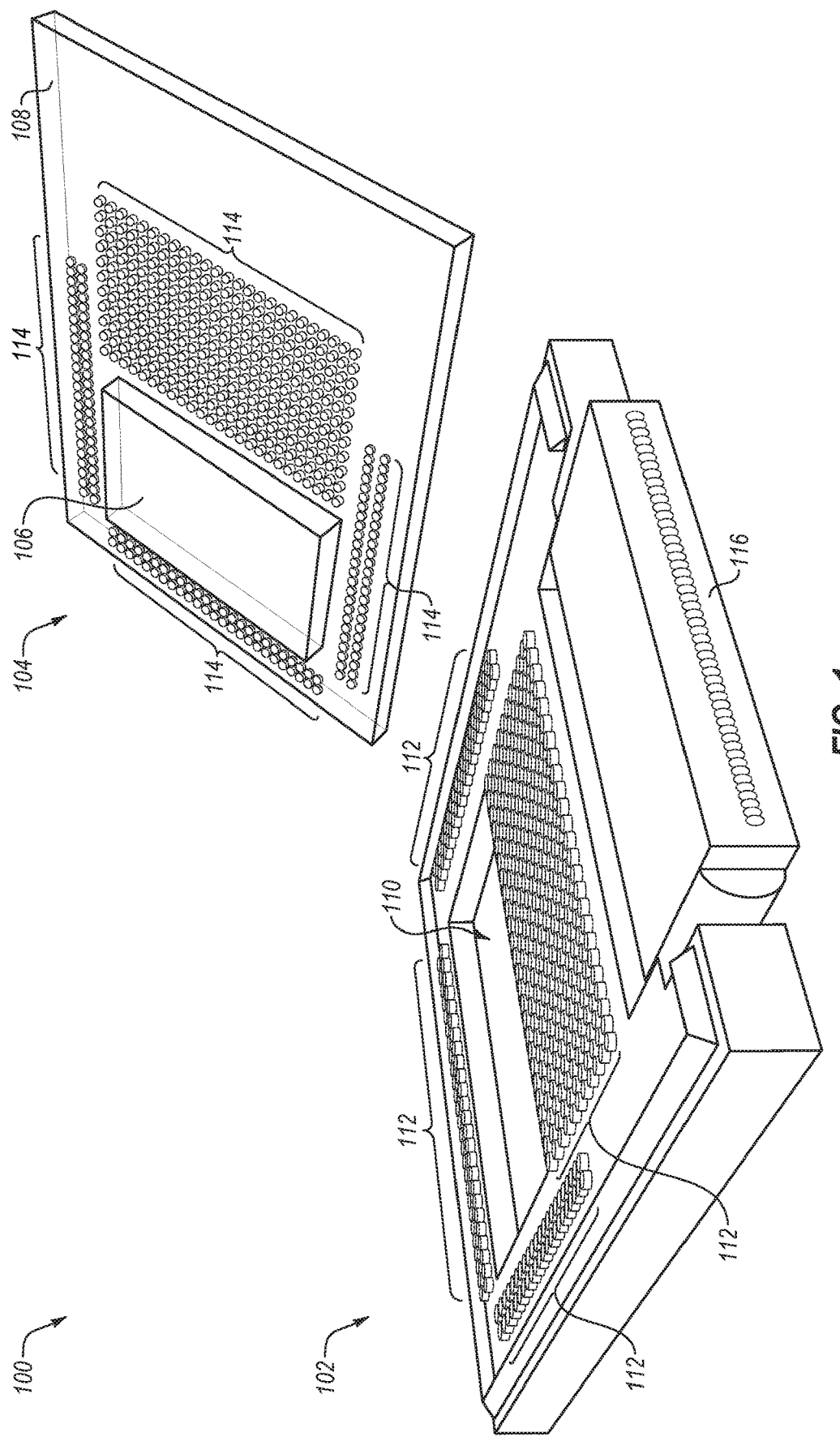
FIG. 1 is a perspective view of an example optoelectronic module.

The present disclosure generally relates to assembly and packaging configurations for optoelectronic modules.

Optoelectronic modules, such as transceivers, are increasingly used to transmit data between different devices or different locations. In particular, optical signals maybe used to rapidly communicate data (via the optical signals) between different devices or different locations. However, most electronic devices operate using electrical signals. Accordingly, optoelectronic modules may be used to convert optical signals to electrical signals and/or convert electrical signals to optical signals, so optical signals may be used to transmit data between electronic devices. Optoelectronic modules may communicate with a host device by transmitting electrical signals to the host device and receiving electrical signals from the host device. These electrical signals may then be transmitted by the optoelectronic module as optical signals.

Optoelectronic modules may be implemented in optical networks used to communicate optical signals for transmitting information among various nodes of a telecommunications network. To transmit data in an optical network, the data may be converted from an electrical signal to an optical signal using optoelectronic components, or vice versa. Optical networks are one example of an environment where the optoelectronic modules devices described herein may be implemented. However, the concepts described may also be implemented in other circumstances. For example, optoelectronic modules may be implemented in computer processing, sensors, optical routing, signal processing or other suitable applications. The embodiments disclosed herein are not limited to any specific environment unless indicated by context.

Some optoelectronic modules include multiple integrated circuits to perform various tasks, and in some configurations, optoelectronic modules may include both electrical integrated circuits and optical integrated circuits. One difficulty with the inclusion of multiple integrated circuits is positioning many different components in a relatively small area. As the density of components increases, components may be positioned closer to one another, as well as connections coupling them together (e.g., electrical or optical connections). Accordingly, designing and manufacturing higher density optoelectronic assemblies and/or optoelectronic modules may lead to various challenges, such as signal integrity, power integrity, thermal performance, electrical coupling and optical coupling.

In some optoelectronic assemblies, silicon photonics may be implemented for optical or optoelectronic components. For example, silicon photonics may be implemented as optical integrated circuits. Silicon photonics generally involve the use of silicon as an optical medium for optical or optoelectronic devices. In some photonics devices, the silicon may be positioned on top of a layer of silicon, such configurations are known as silicon on insulator (SOI). The silicon may be patterned into photonic components or micro-photonic components. Silicon photonic devices may be made using existing semiconductor fabrication techniques, and because silicon is already used as the substrate for some integrated circuits, it may be possible to create hybrid devices in which the optical and electronic components are integrated onto a single microchip or in single assemblies.

Various assembly and packaging configurations are implemented in manufacturing optoelectronic assemblies. One example is flip chip optoelectronic assemblies, which interconnect components using solder bumps that have been deposited onto pads. In flip chip configurations, solder bumps may be deposited on pads on a top side of a first component, the first component may be flipped over so that its top side faces down, and aligned so that its pads align with matching pads on a second component. The first and second components may be mechanically and electrically coupled to one another by solder reflow, such that the pads of the first and second components are attached to one another by the solder bumps. Flip chip configurations may be contrasted with wire bonding configurations, which typically have two components which are both mounted upright, one on top of another, with pads on top of both components, and wires used to electrically couple the pads.

The disclosed embodiments include assembly and packaging configurations for optoelectronic modules with flip chip face-to-face die-stacked integrated silicon photonics. Face to face die stacking may permit heterogeneous integration of photonic circuits (e.g., optical assemblies or optical integrated circuits) and electronic circuits (e.g., electrical assemblies or electrical integrated circuits) for high bandwidth density optoelectronic assemblies, such as those that may be implemented in fiber optic transceivers.

Such configurations may be implemented in any suitable optoelectronic modules, however, the configurations may be particularly advantageous in compact form-factor optoelectronic modules to address the challenges of co-packaging silicon photonics optics with electronic components, such as application-specific integrated circuits (ASICs), Field-programmable gate arrays (FPGAs), central processing units (CPUs) microprocessors, or other electronic components that may be implemented in optoelectronic modules.

The disclosed configurations for highly integrated photonic optoelectronic assembly packaging may eliminate wire bonds, improve mechanical integrity, improve power and signal integrity, and provide superior thermal performance. Additionally or alternatively, the disclosed embodiments may support the use of land grid array (LGA) or ball grid array (BGA) packaging or sockets. Further, the disclosed embodiments may facilitate high yield assembly of optical components, such as optical inputs and outputs, which may be co-packaged with electronic components (e.g., ASICs, FPGAs, CPUs, etc.).

Reference will now be made to the drawings and specific language will be used to describe various aspects of the disclosure. Using the drawings and description in this manner should not be construed as limiting its scope. Additional aspects may be apparent in light of the disclosure, including the claims, or may be learned by practice.

FIG. 1 is a perspective view of an example optoelectronic module 100. The optoelectronic module 100 may include an interposer 102 and a stack assembly 104. The stack assembly 104 may include integrated circuits (ICs), such as an electrical integrated circuit (EIC) 106 and an optical integrated circuit (OIC) 108. The OIC 108 may include various integrated optical components for detecting, focusing, and/or modulating optical signals. In some configurations, the OIC 108 may be a photonic circuit or an integrated silicon photonic circuit. The EIC 106 may include various electrical components for transmitting, processing, and/or modulating electrical signals. Additionally, the EIC 106 and the OIC 108 may include optoelectronic components to convert optical signals to electrical signals, convert electrical signals to optical signals, or both.

Such optoelectronic components may include optical transmitters, and/or optical receivers. Additional components may include integrated circuits that perform other physical layer functions such as retiming, forward error correction and equalization. Optical transmitters may be assembled from such components as lasers, laser drivers, modulators, waveguides, gratings, wavelength division multiplexers, splitters, alignment structures and coupling structures. Optical receivers may contain such components as photodiodes, transimpedance amplifiers, waveguides, polarization splitters/combiners/rotators, gratings, wavelength division demultiplexers, and alignment and coupling structures. In some configurations, the optoelectronic components may be arranged as arrays, such as receiver arrays and/or transmitter arrays. Accordingly, in some configurations, the optoelectronic module 100 may be an optical engine. The OIC 108 may include photodiodes integrated with the OIC 108. In some aspects the photodiodes may be germanium photodiodes integrated with the OIC 108. In other aspects, lasers may be optically coupled to OIC 108 through a fiber array via an optical connecter.

In the configuration shown in FIG. 1, the lasers may be positioned outside the optoelectronic module 100 and therefore not shown. Light from the lasers may be coupled to the OIC 108 through a fiber array via an optical connector. However, in other configurations the lasers may be bonded to the OIC 108 proximate the EIC 106. The photodiodes may be integrated components on the OIC 108. In some aspects, the photodiodes may be part of the OIC 108, which may include many other components including the modulators, waveguides, splitters, etc.

The interposer 102 may provide mechanical support to the stack assembly 104 when the components are attached to one another. Furthermore, the interposer 102 may electrically couple the stack assembly 104. Accordingly, the interposer 102 may include electrical couplings 112 to be coupled to the stack assembly 104. Similarly, the stack assembly 104 may include electrical couplings 114 to be coupled to the interposer 102. As shown, the electrical couplings 112 of the interposer 102 may correspond to the electrical couplings 114 of the stack assembly 104. The size, position and arrangement of the electrical couplings 112, 114 may be complimentary to permit them to be coupled to one another. As shown, the electrical couplings 112 may be positioned on a top surface of the interposer 102, and the electrical couplings 114 may be positioned on a top surface of the OIC 108.

The stack assembly 104 may be flip-chip bonded to the interposer 102. In such configurations, the interposer 102 may include a recess 110 sized and shaped to receive the EIC 106 of the stack assembly 104. The stack assembly 104 may be flipped to position the electrical couplings 114 to face the electrical couplings 112 of the interposer 102, which may then be positioned against one another, and then coupled to one another. The electrical couplings 112, 114 may be coupled to one another by any suitable process, for example, by melting solder positioned between the electrical couplings 112, 114, using a technique such as mass reflow. When assembled, the EIC 106 may be partially or fully received in the recess 110 of the interposer 102. In some circumstances, the EIC 106 may be positioned against an interior surface of the interposer 102 that defines the recess 110, thereby providing mechanical support for the EIC 106.

The optoelectronic module 100 may include an optical connector 116 to optically couple the OIC 108 with optical fibers. In some configurations, the optical connector 116 may optically couple the OIC 108 to an array of optical fibers. The optical connector 116 may be included in the interposer 102 or they may be separate components. If the optical connector 116 and the interposer 102 are separate components, the interposer 102 and the optical connector 116 may be coupled to one another.

As shown, the EIC 106 and the OIC 108 may be coupled to one another to form the stack assembly 104. In such configurations, the stack assembly 104 may be a silicon photonic stacked die. The EIC 106 may be referred to as a daughter or top die, and the OIC 108 may be referred to as a mother or bottom die. The EIC 106 and the OIC 108 may be assembled or bonded face to face (F2F) with respect to one another, and may be coupled using fine pitch copper pillars or other suitable mechanical and/or electrical couplings. The electrical couplings may be formed using thermal compression bonding or mass reflow.

Although any suitable configuration may be implemented, in some configurations the electrical couplings 112, 114 may include copper (Cu) pillars or C4 balls, the interposer 102 may include a ceramic or other suitable substrate material, and the optical connector 116 may include glass, silicon, or any other suitable transparent material for transmitting optical signals. In some configurations, the electrical couplings 112, 114 that couple the stack assembly 104 to the interposer 102 may be larger in diameter and/or pitch than the electrical couplings that couple the EIC 106 and the OIC 108.

As mentioned, the optical connector 116 may be coupled to the interposer 102. In such configurations, the interposer 102 may include a window and/or recess to receive the optical connector 116 and/or other optical components. The window and/or recess may permit a silicon photonic adiabatic mode converter or grating coupler to be exposed to align the optical connector 116 with a fiber array. In such configurations, the optoelectronic module 100 may be powered up to optically align the optical components to one another.

FIGS. 2A-2F are perspective views of another example of an optoelectronic module 200. The optoelectronic module 200 may include any suitable aspects described above with respect to the optoelectronic module 100, although some features may have differing configurations, and some components, such as the electrical couplings, are not shown.

The optoelectronic module 200 may include an interposer 202 and a stack assembly 204. The stack assembly 204 may include ICs, such as an EIC 206 and an OIC 208. The OIC 208 may include various integrated optical components for directing, focusing, and/or modulating optical signals. In some configurations, the OIC 208 may be a photonic circuit or an integrated silicon photonic circuit. The EIC 206 may include various electrical components for transmitting, processing, and/or modulating electrical signals. Additionally, either the EIC 206 or the OIC 208 may include optoelectronic components to convert optical signals to electrical signals, convert electrical signals to optical signals, or both. In some configurations, the optoelectronic module 200 may be an optical engine.

Such optoelectronic components may include optical transmitters, and/or optical receivers. Additional components may include integrated circuits that perform other physical layer functions such as retiming, forward error correction and equalization. Optical transmitters may be assembled from such components as lasers, laser drivers, modulators, waveguides, gratings, wavelength division multiplexers, splitters, alignment structures and coupling structures. Optical receivers may contain such components as photodiodes, transimpedance amplifiers, waveguides, polarization splitters/combiners/rotators, gratings, wavelength division demultiplexers, and alignment and coupling structures. In some configurations, the optoelectronic components may be arranged as arrays, such as receiver arrays and/or transmitter arrays. Accordingly, in some configurations, the optoelectronic module 100 may be an optical engine. The OIC 208 may include photodiodes integrated with the OIC 208. In some aspects the photodiodes may be germanium photodiodes integrated with the OIC 208. In other aspects, lasers may be optically coupled to OIC 208 through a fiber array.

The interposer 202 may provide mechanical support to the stack assembly 204 when the components are attached to one another. Furthermore, the interposer 202 may electrically couple the stack assembly 204. Although not shown, the interposer 202 and the stack assembly 204 may include electrical coupling as described with respect to FIG. 1.

The interposer 202 may include a recess 210 sized and shaped to receive the EIC 206 of the stack assembly 204. The EIC 206 may be partially or fully received in the recess 210 of the interposer 202 (see, e.g., FIGS. 2A and 2B).

The optoelectronic module 200 may include an optical connector 216 to optically couple the OIC 208 with optical fibers 222. In some configurations, the optical fibers 222 may be an array of optical fibers, for example, in a linear configuration, although other configurations may be implemented. As shown, the optical connector 216 and the interposer 202 may be separate components coupled to one another.

The optical connector 216 may include a body 228, which may include or may be formed of a transparent substrate, such as glass, silicon, or other suitable transparent material. The body 228 may define grooves, slots or openings sized and shaped to receive the optical fibers 222. The position of the grooves, slots or openings may correspond to the position of the optical fibers 222 in the fiber array. In some configurations, the optical connector 216 may include grooves, slots or openings for each corresponding one of the optical fibers 222, although other configurations may be implemented.

The optoelectronic module 200 may include an adiabatic mode converter (AMC) 220. The AMC 220 may optically couple OIC 208 and the optical connector 216, which may be optically coupled to the optical fibers 222. The AMC 220 may be also be mechanically coupled to the OIC 208 to serve as an interface block between the optical connector 216, the optical fibers 222, and the OIC 208. In some configurations, the OIC 208 may include a silicon photonic integrated circuit, and the AMC 220 may include silicon nitride adiabatic couplers to optically couple the OIC 208 with the optical connector 216 and/or the optical fibers 222. An example of such aspects is included in U.S. Pat. No. 9,874,691, which is hereby incorporated by reference in its entirety.

As shown, the interposer 202 may include a recess 218 sized and shaped to receive the AMC 220 and/or a portion of the optical connector 216. The recess 218 may permit the AMC 220 to be aligned with the optical connector 216 and/or the OIC 208.

The optoelectronic module 200 may include one or more alignment features to align the optical connector 216, the AMC 220 and/or the interposer 202 with one another. In the illustrated example, the optical connector 216 includes alignment features 224 to align the optical connector 216 with the interposer 202. The interposer 202 includes alignment features 226 corresponding to the alignment features 224 of the optical connector 216. The alignment features 224, 226 may permit the optical connector 216 and the interposer 202 to be aligned and/or coupled to one another. In particular, the alignment features 224, 226 may permit the optical connector 216 to be moved with respect to the interposer 202 in one direction (or vice versa, where the interposer 202 may be moved with respect to the optical connector 216), while restricting movement in other directions.

In the illustrated configuration, the alignment features 224 are pins (e.g., round pins) attached to the optical connector 216 and the alignment features 226 are corresponding holes defined in the body of the interposer 202. In particular, the pins of the optical connector 216 are sized and shaped to mate with and be received in corresponding holes of the interposer 202. However, this configuration is just one example of mating alignment features. Any other suitable mating alignment features may be implemented on the optical connector 216 and the interposer 202. In addition, although the pin and hole configuration of the alignment features 224, 226 restrict movement in two directions (e.g., X and Y) while permitting movement in a third direction (e.g, Z), other configurations may be implemented that permit additional range of motion. For example, slots or rips may be implemented to permit movement in two direction (e.g., Z and X) while restricting movement in one direction (e.g., Y). In some circumstances, the optoelectronic module 200 may be powered up to optically align the optical components to one another.

FIGS. 2A-2F illustrate an example of an assembly process for the optoelectronic module 200. With attention to FIGS. 2A-2F, aspects of assembling the optoelectronic module 200 will be described in further detail.

Figure 2A:
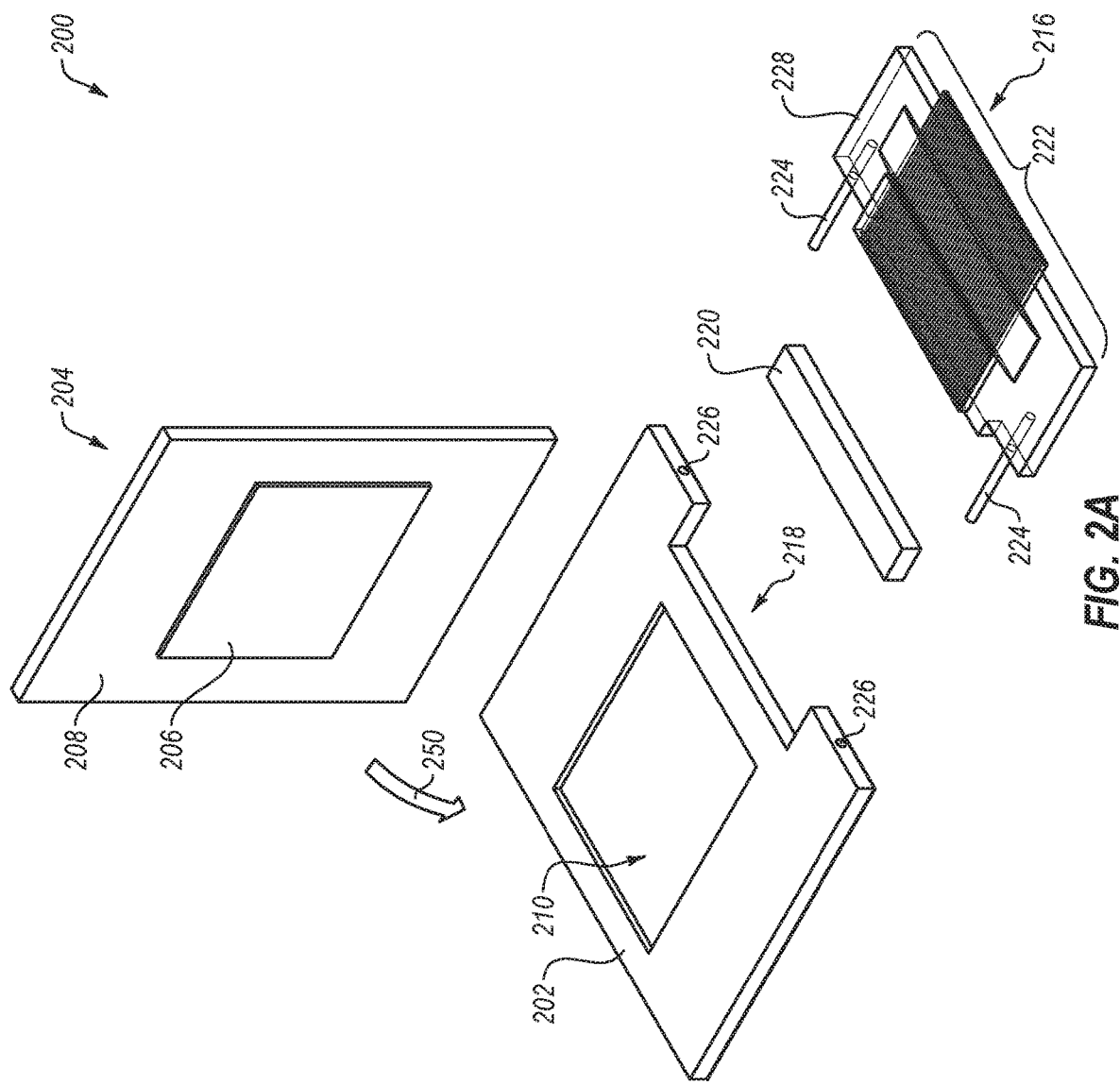
FIGS. 2A-2F are perspective views of another example of an optoelectronic module.

As shown in FIG. 2A, the EIC 206 and the OIC 208 may be coupled to one another to form the stack assembly 204. In such configurations, the stack assembly 204 may be a silicon photonic stacked die. The EIC 206 may be referred to as a daughter or top die, and the OIC 208 may be referred to as a mother or bottom die. The EIC 206 and the OIC 208 may be assembled or bonded face to face (F2F) with respect to one another, and may be coupled using fine pitch copper pillars or other suitable mechanical and/or electrical couplings. The electrical couplings may be formed using thermal compression bonding or mass reflow. In some configurations, the electrical couplings that couple the stack assembly 204 to the interposer 202 may be larger in diameter and/or pitch than the electrical couplings that couple the EIC 206 and the OIC 208 to one another.

The stack assembly 204 may be flip-chip bonded to the interposer 202, or vice versa. As indicated by arrow 250, the stack assembly 204 may be flipped such that the EIC 206 is facing the interposer 202. The stack assembly 204 and the interposer 202 may be positioned against one another, and then electrically and mechanically coupled. Although not shown, electrical couplings of the OIC 208 may be positioned to face the electrical couplings of the interposer 202, which may then be positioned against one another, and then coupled to one another. The electrical couplings may be coupled to one another by any suitable process, for example, by melting solder positioned between the electrical couplings using a technique such as mass reflow. When assembled, the EIC 206 may be partially or fully received in the recess 210 of the interposer 202. Additionally or alternatively, the EIC 206 may be positioned against an interior surface inside the recess 210.

Figure 2B:
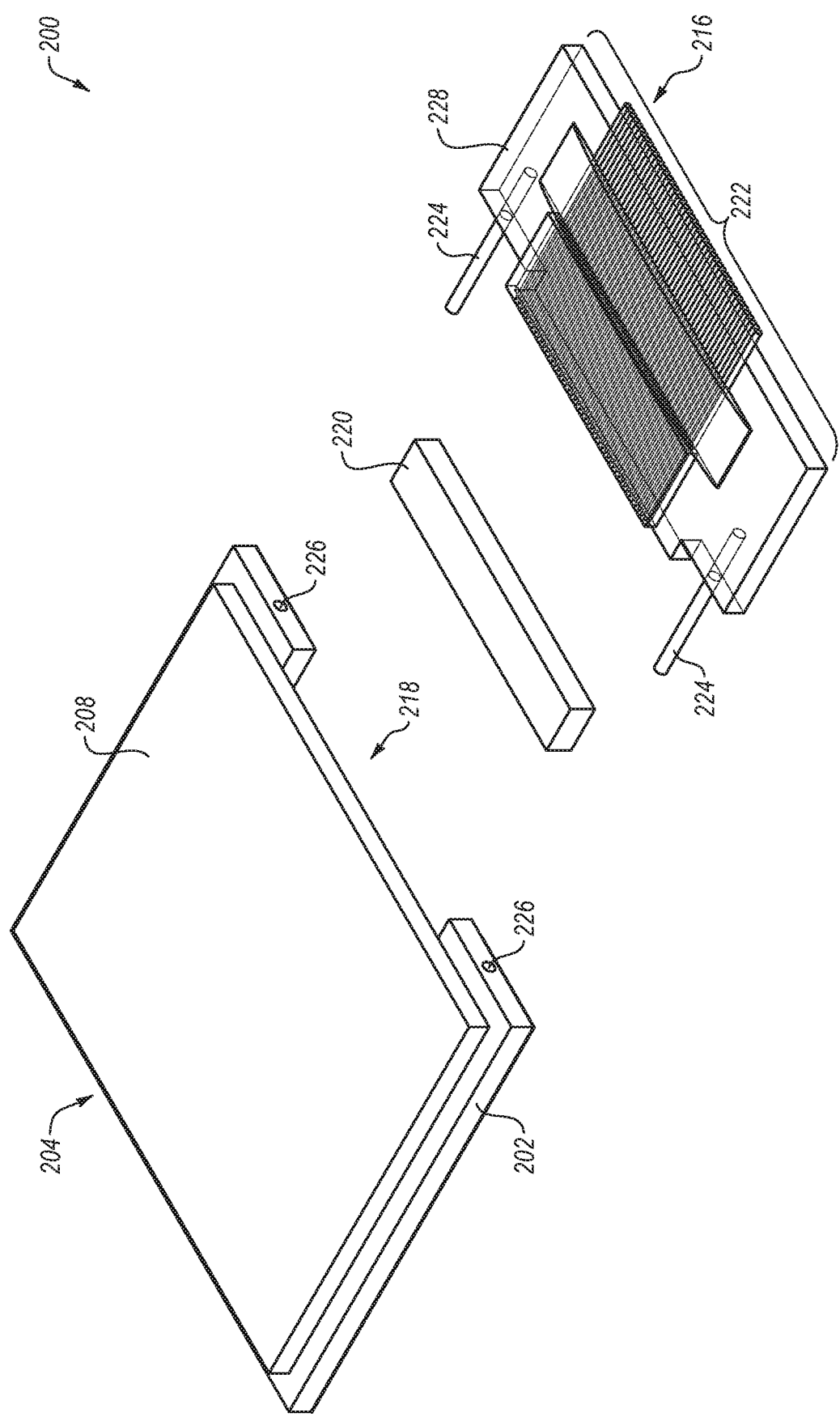
Figure 2C:
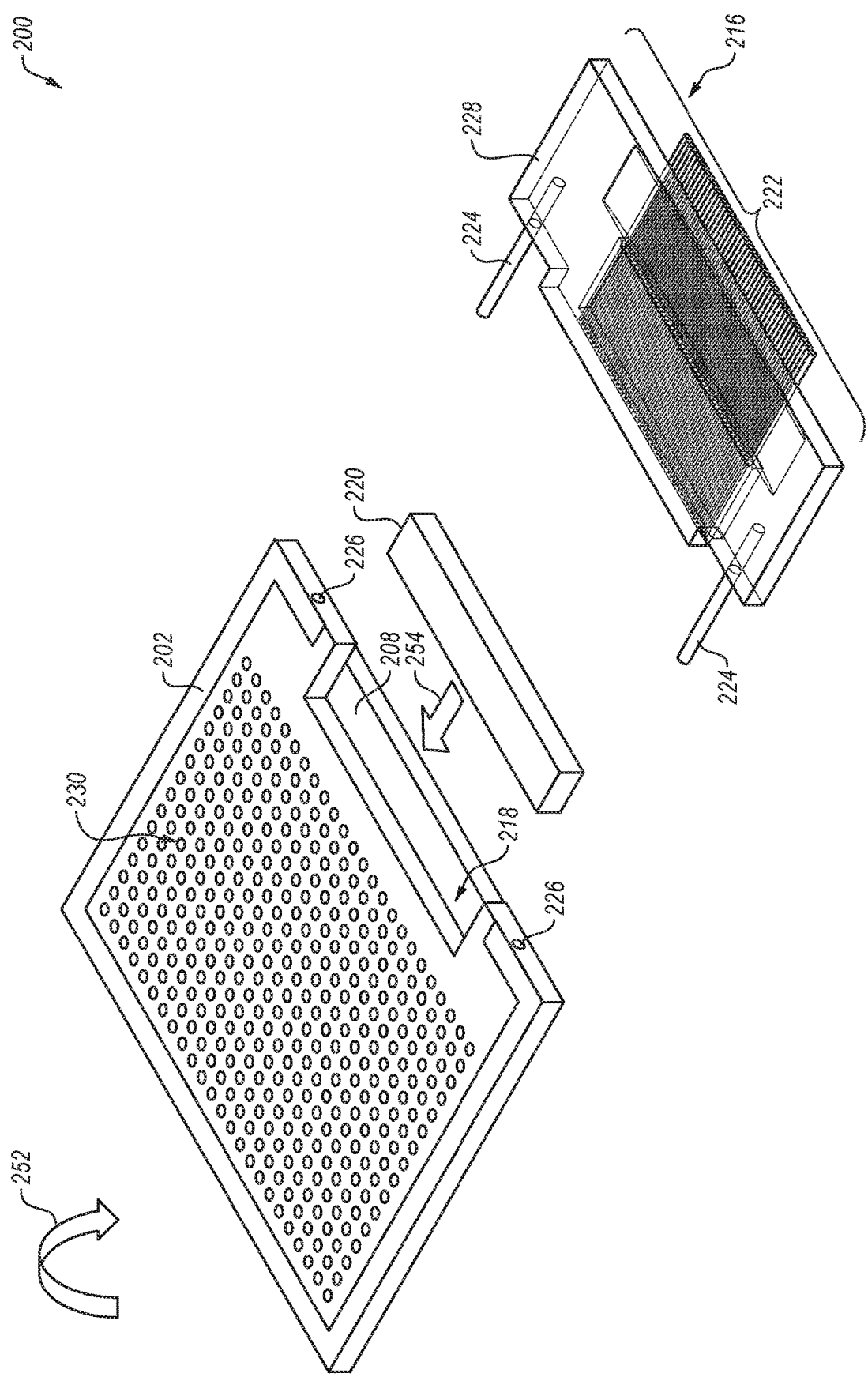

FIG. 2B shows the stack assembly 204 flip chip bonded to the interposer 202, as described above. While FIG. 2B illustrates a top perspective view of the optoelectronic module 200, FIG. 2C illustrates a bottom perspective view of the optoelectronic module 200. As indicated by arrow 252 in FIG. 2C, the optoelectronic module 200 may be flipped over, for example, after the stack assembly 204 is flip-chip bonded to the interposer 202. As shown, the interposer 202 may include electrical couplings 230 to electrically couple the interposer 202.

As indicated by the arrow 254, the AMC 220 may be positioned in the recess 218 defined by the interposer 202. As shown, the recess 218 exposes a portion of the OIC 208. The AMC 220 may be optically and/or mechanically coupled to the OIC 208 at the portion exposed by the recess 218 defined by the interposer 202. In some configurations, the AMC 220 may be attached directly to the OIC 208, without being coupled to the interposer 202, although other configurations may be implemented. The AMC 220 may be positioned against one or both of the interposer 202 and/or the OIC 208.

Figure 2D:
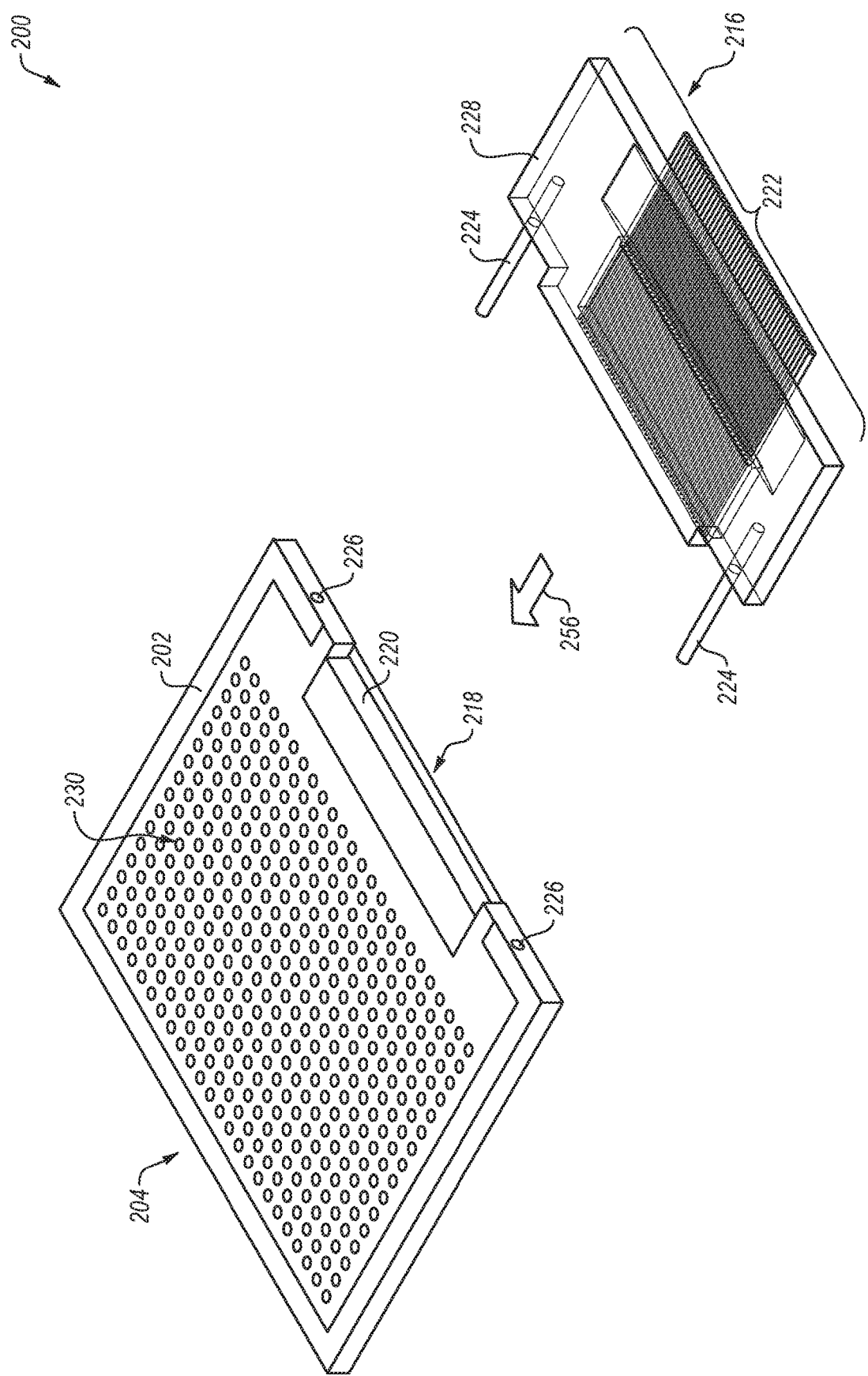

FIG. 2D shows the AMC 220 positioned in the recess 218 and coupled to the OIC 208. As shown, when the AMC 220 positioned in the recess 218, a portion of the recess 218 remains to receive a portion of the optical connector 216. In such configurations, the recess 218 may be sized and shaped to receive both the AMC 220 and a portion of the optical connector 216.

As indicated by the arrow 256, the optical connector 216 may be coupled to the interposer 202, with the AMC 220 positioned in between. A portion of the optical connector 216 may be positioned at least partially in the recess 218. The corresponding alignment features 224, 226 may be positioned to mate with one another. In the illustrated configuration, the pins of the alignment features 224 are positioned inside of the holes of the alignment features 226, although other configurations may be implemented. The optical connector 216 may be positioned against the AMC 220 and the interposer 202, and the components may be coupled to one another.

Figure 2E:
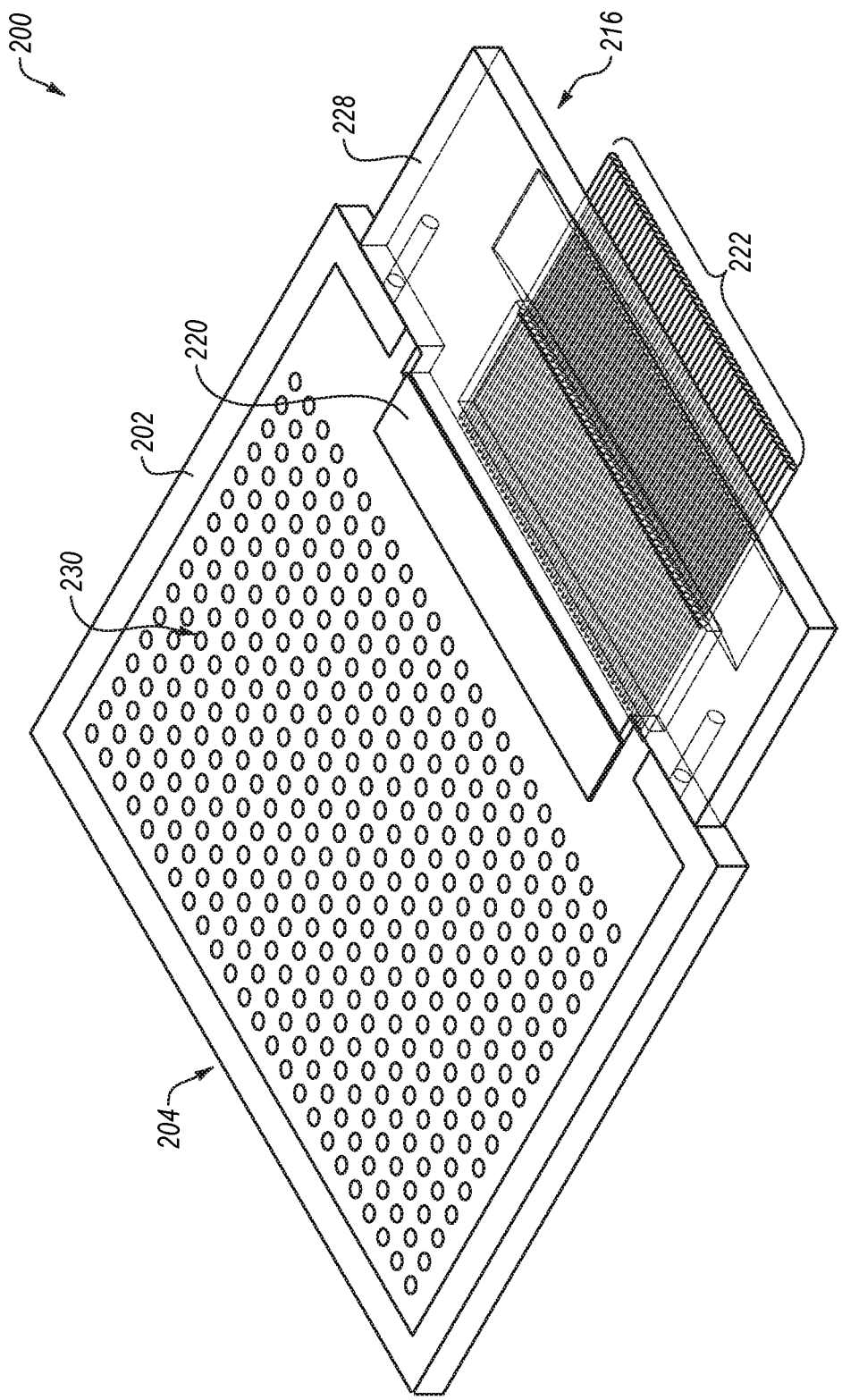

FIG. 2E shows the optical connector 216 coupled to the interposer 202 with the AMC 220 positioned in between. In such configurations, the AMC 220 may optically couple the optical fibers 222 of the optical connector 216 with the OIC 208. Furthermore, the optical connector 216, the optical fibers 222, the AMC 220, and/or the OIC 208 may be optically and mechanically aligned with one another.

Figure 2F:
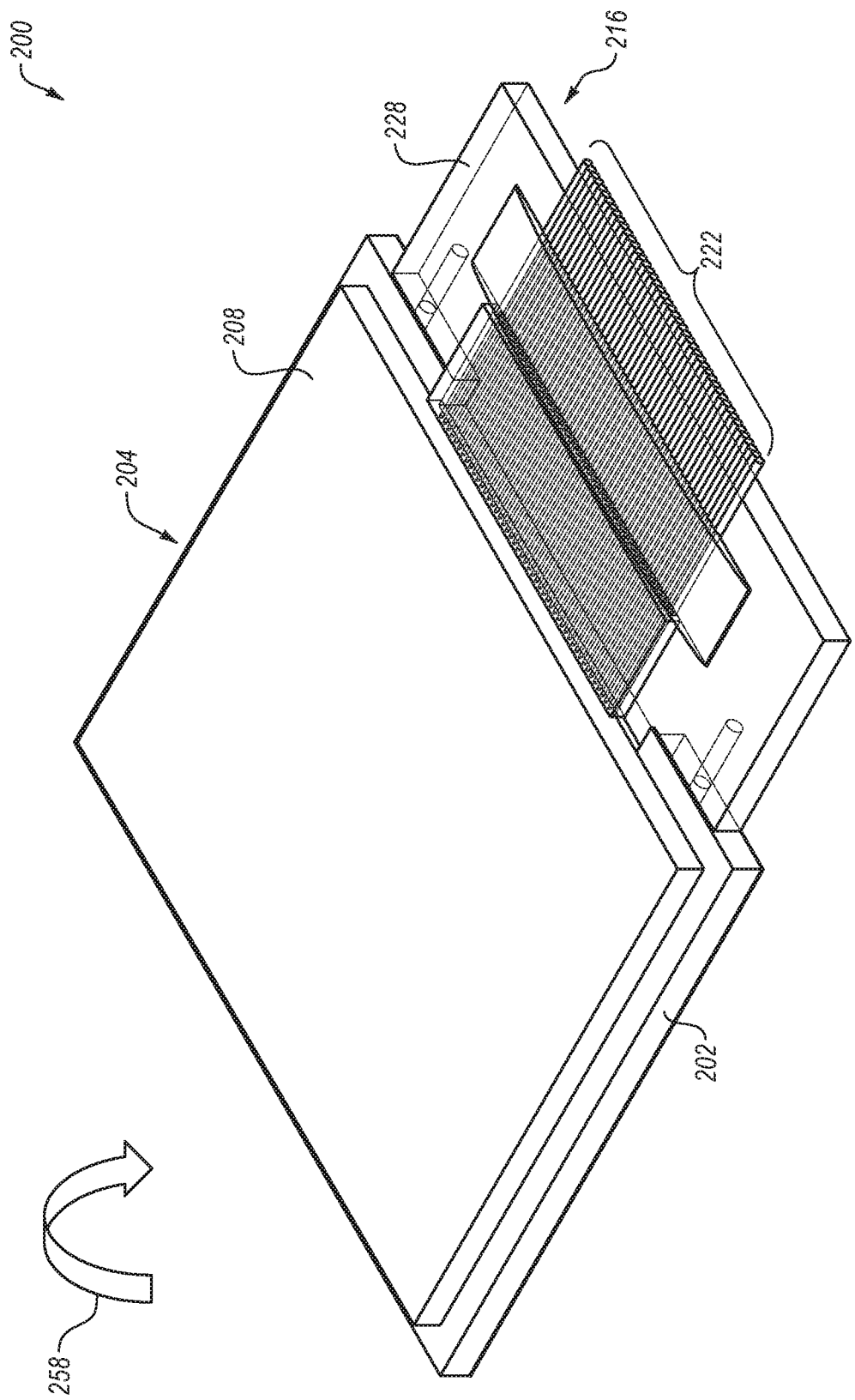

While FIG. 2E illustrates a bottom perspective view of the optoelectronic module 200, FIG. 2F illustrates a top perspective view of the optoelectronic module 200. As indicated by arrow 258 in FIG. 2F, the optoelectronic module 200 may be flipped over, for example, after the optical connector 216 is coupled to the interposer 202. The optoelectronic module 200 may then be coupled to other components, as will be described in further detail below.

Figure 3:
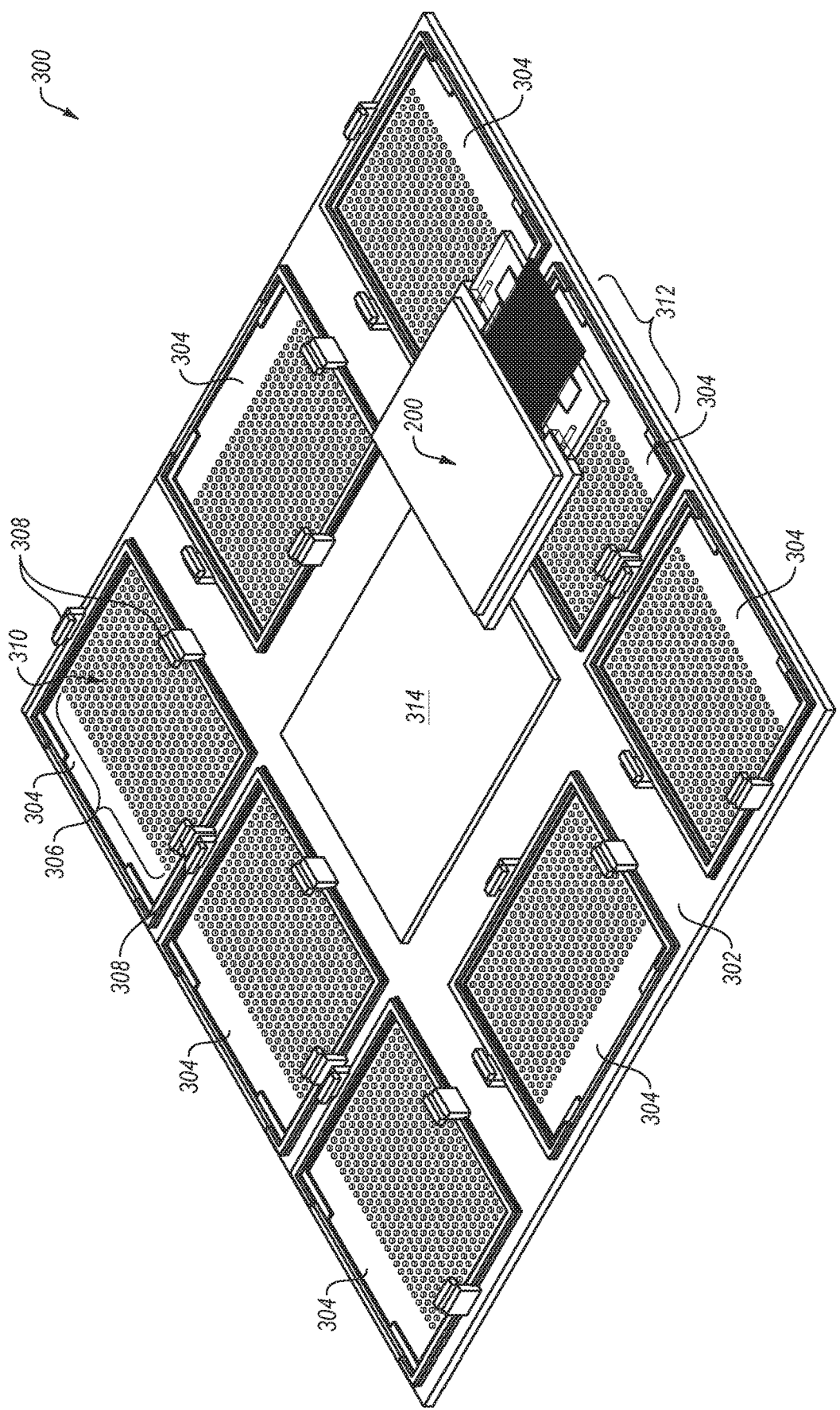
FIG. 3 is a perspective view of an example multiple chip module that may include the optoelectronic module of FIGS. 2A-2F.

FIG. 3 is a perspective view of an example multiple chip module (MCM) 300. The MCM 300 may be implemented to removably co-package multiple optoelectronic modules and/or optical interconnects for optical fibers. The MCM 300 may include a substrate 302 and one or more sockets 304, which may be positioned on the substrate 302. The sockets 304 may each removably receive an optoelectronic module. Furthermore, the sockets 304 may electrically and mechanically couple optoelectronic modules to the MCM 300. Accordingly, the sockets 304 may include electrical couplings 306 to electrically couple with the optoelectronic modules, fasteners 308 to mechanically couple the optoelectronic modules to the MCM 300, and receptacles 310 sized and shaped to receive the optoelectronic modules. In FIG. 3, the electrical couplings 306, fasteners 308, and receptacle 310 are labeled for one of the sockets 304, although each of the sockets 304 may include such features.

In the illustrated configuration, each of the sockets 304 includes three of the fasteners 308, however, any suitable number and configuration of fasteners may be implemented. The fasteners 308 may removably couple the optoelectronic modules to the MCM 300. In the illustrated configuration, the fasteners 308 are resilient tabs that may be spread apart to permit the optoelectronic modules to be inserted and retained in the receptacles 310. However, other configurations of the fasteners 308 may be implemented. The fasteners 308 may be spread apart to permit the optoelectronic modules to be removed from the receptacles 310. Accordingly, the fasteners 308 may removably retain the optoelectronic modules in the fasteners.

As mentioned above, the sockets 304 of the MCM 300 may receive optoelectronic modules, such as the optoelectronic module 200 of FIGS. 2A-2F. FIG. 3 illustrates the optoelectronic module 200 positioned over one of the sockets 304. The optoelectronic module 200 may be positioned in the receptacle 310 of the socket 304. As shown, the receptacle 3310 is sized and shaped to receive the optoelectronic module 200. The electrical couplings 306 of the socket 304 may correspond to the electrical couplings 230 of the optoelectronic module 200 (see, for example, FIG. 2E).

The electrical couplings 230 may be positioned against the electrical couplings 306 to electrically couple the optoelectronic module 200 to the MCM 300. The fasteners 308 may removably retain the optoelectronic module 200 in the receptacle 310. Accordingly, the fasteners 308 may be sized and positioned to at least partially surround the optoelectronic module 200 to retain the optoelectronic module 200 in the receptacle 310. Specifically, the fasteners 308 may be positioned against and at least partially surround the interposer 202 and/or the stack assembly 204 of the optoelectronic module 200. Although FIG. 3 illustrates one optoelectronic module 200, corresponding optoelectronic modules may be positioned in each of the socket 304 of the MCM 300.

As shown, the socket 304 defines a perimeter corresponding to the size and shape of the optoelectronic module 200. The perimeter includes a recess 312 sized and shaped to permit the optical connector 216 and/or the optical fibers 222 to extend out of the socket 304. Such configurations permit the optoelectronic module 200 to be optically coupled with components outside of the MCM 300.

The MCM 300 may include an IC 314. The IC 314 may be a switch ASIC, FPGA, CPUs, etc. The IC 314 may be electrically coupled to the optoelectronic modules attached to the MCM 300 via the electrical couplings 306. The IC 314 may route electrical signals to the optoelectronic modules. As mentioned, the optoelectronic module 200 may be an optical engine. Accordingly, in the configurations shown in FIG. 3, eight optoelectronic modules or optical engines may be co-packaged on the MCM 300. The optical engines may be electrically interfaced with the IC 314 and optically interfaced with optical fibers extending from the MCM 300. In some configurations, the optical engines may include LGA packaging and/or the MCM 300 may include corresponding LGA sockets. Such configurations may be implemented for high speed LGA socket interfaces with the adjacent IC 314 (which may be a switch circuit).

Figure 4:
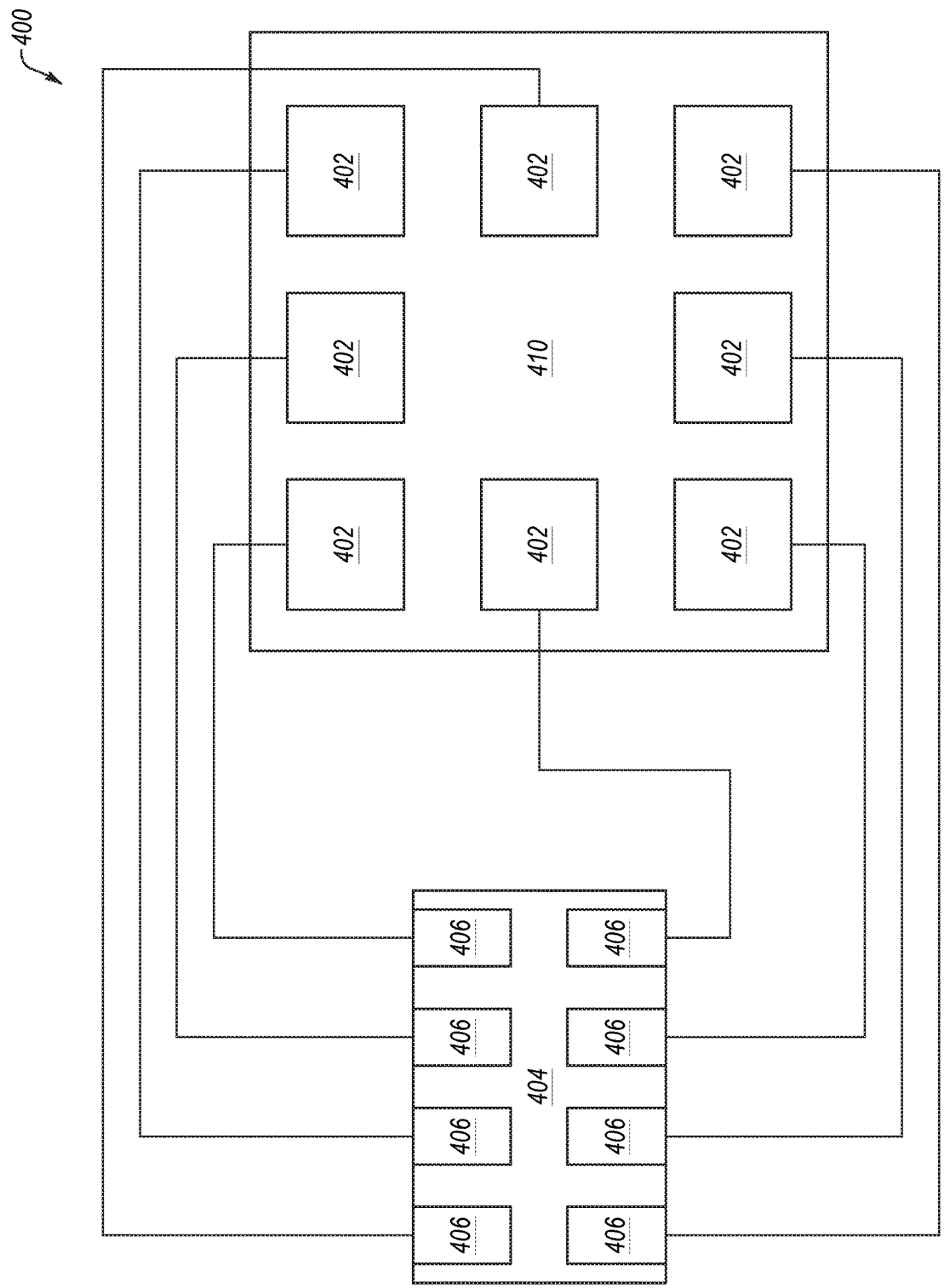
FIG. 4 is a schematic view of another example of a multiple chip module assembly.

The MCM 300 may include various optoelectronic modules with optoelectronic components that covert electrical signals to optical signals, or vice versa. However, in other configurations, the optoelectronic components may be included separate of the MCM 300. In such configurations, the modules may include optical components, rather than optoelectronic components. FIG. 4 illustrates an example of such a configuration.

FIG. 4 is a schematic view of an example of an MCM assembly 400. As illustrated, the MCM assembly 400 may include an MCM 410 with optical chips 402. The optical chips 402 may be positioned on the MCM 410, in a manner similar to the configuration shown and described with respect to FIG. 3. However, rather than including optoelectronic components on the optical chips 402, the optoelectronic components may be included in an external optoelectronic assembly 404. The optoelectronic assembly 404 may include optoelectronic components 406. The optoelectronic components 406 may be optical transmitters such as lasers, or optical receivers such as photodiodes. In the illustrated configuration, the optoelectronic assembly 404 includes eight optoelectronic components 406, one for each of the optical chips 402.

As indicated, each of the optoelectronic components 406 are optically coupled with a corresponding one of the optical chips 402. The optoelectronic components 406 and the optical chips 402 may be optically coupled to one another with a fiber or other suitable optical coupling. In some configurations, the optoelectronic components 406 may generate optical signals, which may be transmitted and/or modulated by the optical chips 402, to optical fibers coupled to the optical chips 402. In other configurations, the optoelectronic components 406 may receive optical signals, which may be transmitted and/or modulated by the optical chips 402 from the optical fibers.

The configurations shown in FIG. 4 may provide optical transmitters and/or optical receivers off-chip with respect to the MCM 410 and the optical chips 402. In some aspects, the optoelectronic components 406 may be lasers and the optoelectronic assembly 404 may be a laser bank. The laser bank may be mounted and cooled separately from the MCM 410 and the optical chips 402. Such configurations may improve efficiency and reliability of the MCM 410 and associated MCM assembly 400. Each of the optoelectronic components 406 may include one or more lasers and may power one of the optical chips 402 via a polarization maintaining (PM) fiber array. Furthermore, the optoelectronic components 406 may be removable laser modules to further improve serviceability and/or reliability.

Figure 5:
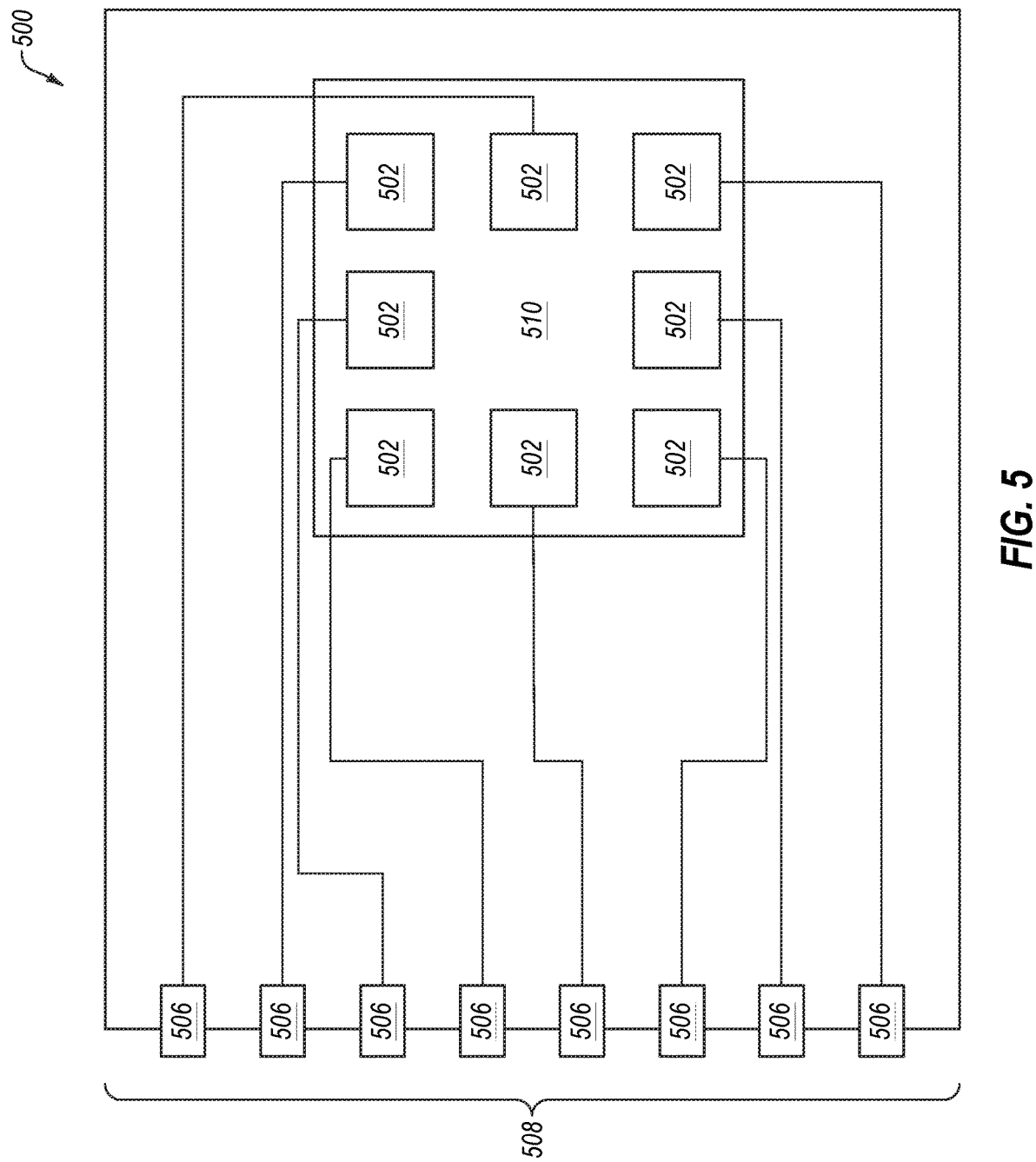
FIG. 5 is a schematic view of another example of a multiple chip module assembly.

FIG. 5 is a schematic view of another example of an MCM assembly 500. As illustrated, the MCM assembly 500 may include an MCM 510 with optical chips 502. The optical chips 502 may be positioned on the MCM 510. Rather than including optoelectronic components on an external optoelectronic assembly (as described with respect to FIG. 4), the MCM assembly 500 may include optoelectronic components 506 removably coupled to a switch box faceplate 508 of the MCM assembly 500. The optoelectronic components 506 may be optical transmitters such as lasers, or optical receivers such as photodiodes. In the illustrated configuration, the MCM assembly 500 includes eight optoelectronic components 506, one for each of the optical chips 502. Each of the optoelectronic components 506 may be optically coupled with a corresponding one of the optical chips 502.

The configurations shown in FIG. 5, which includes the optoelectronic components 506 removably coupled to the switch box faceplate 508, may improve reliability and serviceability of the MCM assembly 500, because the optoelectronic components 506 may be removed and replaced as needed.

In some aspects, the optoelectronic components 506 may be lasers, for example, pluggable laser modules removably attached to the switch box faceplate 508. In some configurations, the laser modules maybe attached to the MCM assembly 500 after the MCM assembly 500 is deployed to provide flexibility. Furthermore, the laser module may have specific optical and electrical connectors to optically couple the optoelectronic components 506 to the optical chips 502 and/or to electrically couple the optoelectronic components 506 to corresponding electrical components (e.g., driver circuits, etc.).

The disclosed configurations include highly integrated photonic transceiver assembly and packaging configurations that may eliminate wire bonds, provide mechanical integrity, power and signal integrity, superior thermal performance, supports the use of LGA/BGA sockets if necessary, and/or permits yielded assembly of optical components to be co-packaged with electrical components. Furthermore, the disclosed embodiments include assembly and packaging configurations that may be used as an alternative to multi-chip solutions that use wirebonding or thru substrate vias (TSV) for electrical connection.

The disclosed assembly and packaging configurations may improve signal integrity, power integrity, thermal performance, optical couplings, and provide removable components of improved reliability and serviceability.

With respect to signal integrity, the disclosed embodiments provide control of electrical couplings that results in relatively low parasitic electrical interconnects through face to face EIC/OIC coupling and flip-chip OIC to interposer coupling. Such electrical couplings may be radio frequency RF couplings which may require relatively tight tolerances for suitable performance, and the disclosed embodiments permit control of tolerances to maintain suitable RF performance.

The disclosed configurations may also improve power integrity, which may be relevant in high speed complementary metal-oxide-semiconductor (CMOS) integrated circuit configurations. Multiple parallel optical channels may include components such as retimers, equalizers, Mach-Zehnder modulator drivers, electro-absorption modulators, optical ring drivers, transimpedance amplifiers, or other components which may produce large supply dynamic currents. Transimpedance amplifiers, equalizers, and retimers may be sensitive to electrical supply ripples and ground noise and therefore may benefit broadband low impedance power distribution networks both on chips and off-chips. The flip-chip packaging approach described herein results in a suitable power supply and ground distribution.

The disclosed embodiments improve thermal performance because the highly integrated high speed electronic components dissipate heat in a fairly small footprint as a result of the EIC being stacked on the silicon photonic OIC. Using flip-chip couplings for the stacked EIC/OIC, the larger IC may be configured to be in contact with a Thermal Interface Material (TIM) and/or a heat sink, thus acting as a heat spreader. For example, a 500 μm thickness of TIM with a k of 6 W/(m·K) on the back of a 20×25 mm photonic OIC will add another $50/(6e{-}3{*}(20{*}25)/0.5)=9$ deg C. instead of 30 deg C. if the TIM was on the back of the EIC (if the EIC is 11×12 mm). Such differences in heat dissipation may be important for reliability and performance of the ICs, particularly when other temperature-sensitive components such as semiconductor lasers are included in a package.

The disclosed configurations may permit optical fiber array attachment to be one of the last step assembly steps and may provide the ability to use pigtailed and/or connectorized optical interfaces. Standardized packaging configurations may be used to assemble the silicon photonic stack for OIC. Active optical interface attachment may be performed last, thereby avoiding optical epoxies to be exposed to the elevated temperatures typically found in reflow processes. The disclosed packaging and assembly configurations may also provide a mechanical platform on which to attach the fiber array or connector which would not be present if the stack was mounted "stack up" using wirebonds or TSVs on an electronic substrates.

The disclosed configurations also permit components to be removed, which in turn may improve reliability and serviceability. High speed LGA sockets or interposers may be implemented to offer removable optical interfaces. Such configurations may include benefits for component testing, reworking, yields etc. Without this removability advantage, a co-packaged optoelectronic solution may suffer from serviceability disadvantages. In addition, the removable optics configurations described herein may permit pluggable optoelectronic modules to be used in switch ASIC co-packaged optics and silicon photonic assemblies.

Figure 6A:
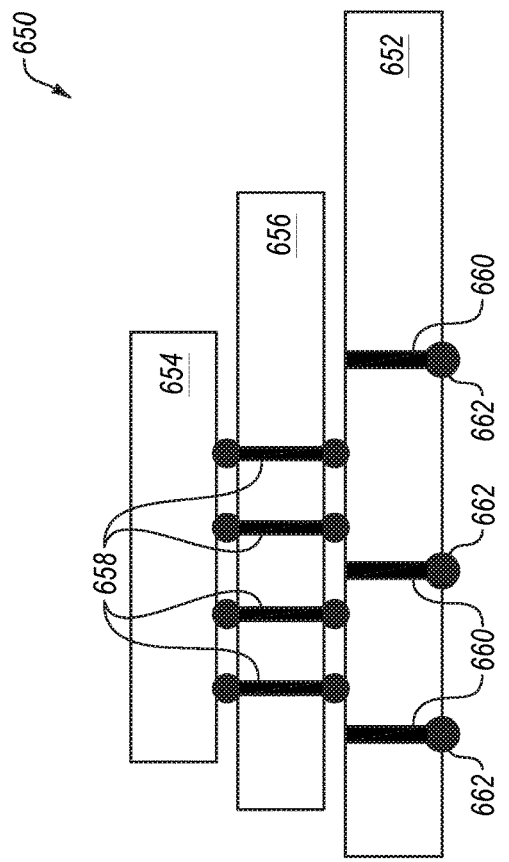
FIGS. 6A-6B are side cross-sectional views of examples optoelectronic modules.
Figure 6B:
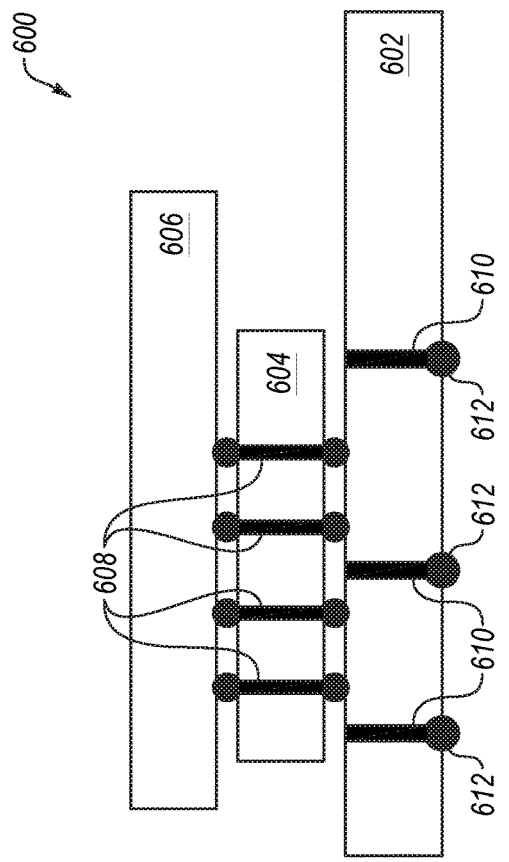

As mentioned above, the disclosed embodiments include packaging configurations that may be used as an alternative to thru substrate vias (TSV). However, the concepts described herein may also be implemented with configurations that include TSVs. FIGS. 6A-6B include examples of configurations that include TSVs that may be implemented according to the concepts described herein.

FIGS. 6A-6B are side cross-sectional views of examples optoelectronic modules. FIG. 6A illustrates an optoelectronic module 600 and FIG. 6B illustrates an optoelectronic module 650.

The optoelectronic module 600 includes an interposer 602, and EIC 604, and an OIC 606. In the illustrated configuration, the EIC 604 is positioned over and coupled to the interposer 602, and the OIC 606 is positioned over and coupled to the EIC 604. Similar configurations are shown and described in FIGS. 1 and 2A-2F, which also include EICs positioned between corresponding interposers and OICs. As illustrated, the EIC 604 may include TSVs 608. The TSVs 608 may extend through the EIC 604 and may electrically couple the EIC 604 with other components. In particular, the TSVs 608 may electrically couple the interposer 602 and the OIC 606. The interposer 602 may include vias 610. The vias 610 may extend through the interposer 602 and may electrically couple the interposer 602 with other components. In particular, the vias 610 may electrically couple the EIC 604 with external components, such as an MCM. Accordingly, the interposer 602 may include pads 612 which may be electrically coupled to corresponding electrical couplings of a socket of an MCM (see, for example, FIG. 3 and associated description)

In the configuration of FIG. 6A, the OIC 606 and the EIC 604 may be electrically and mechanically coupled to one another, the resulting stack may be flipped and the EIC 604 may be electrically and mechanically coupled to the interposer 602, similar to the configurations described with respect to the FIGS. 2A-2F.

FIG. 6B includes an alternative configuration of an optoelectronic module 650, which includes an OIC 656 positioned between an EIC 654 and an interposer 652. In the illustrated configuration, the OIC 656 is positioned over and coupled to the interposer 602, and the EIC 654 is positioned over and coupled to the OIC 656. Accordingly, in such configurations the position of the OIC 656 and the EIC 654 are switched when compared to the configuration of the optoelectronic module 600 of FIG. 6A.

In the configuration of FIG. 6B, the OIC 656 includes TSVs 658, rather than the EIC 654. The TSVs 658 may extend through the OIC 656 and may electrically couple the EIC OIC 656 with other components. In particular, the TSVs 658 may electrically couple the interposer 652 and the EIC 654. The interposer 652 may include vias 660. The vias 660 may extend through the interposer 652 and may electrically couple the interposer 652 with other components. In particular, the vias 660 may electrically couple the OIC 656 with external components, such as an MCM. Accordingly, the interposer 652 may include pads 662 which may be electrically coupled to corresponding electrical couplings of a socket of an MCM (see, for example, FIG. 3 and associated description)

In the configuration of FIG. 6B, the OIC 656 and the EIC 654 may be electrically and mechanically coupled to one another, and the resulting stack may be electrically and mechanically coupled to the interposer 652, with the OIC 656 positioned between the EIC 654 and the interposer 652.

In the configurations of FIGS. 6A and 6B, the interposers 602, 652 may provide mechanical support for the OIC/EIC stacks, which may make the resulting optoelectronic modules 600, 650 easier to assembly. This in turn may be useful for large chip packaging configurations (e.g., MCMs) and co-packaged optics configurations, such as those described above. In addition, the disclosed configurations may result in improved signal integrity, power integrity and thermal dissipation.

Figure 7:
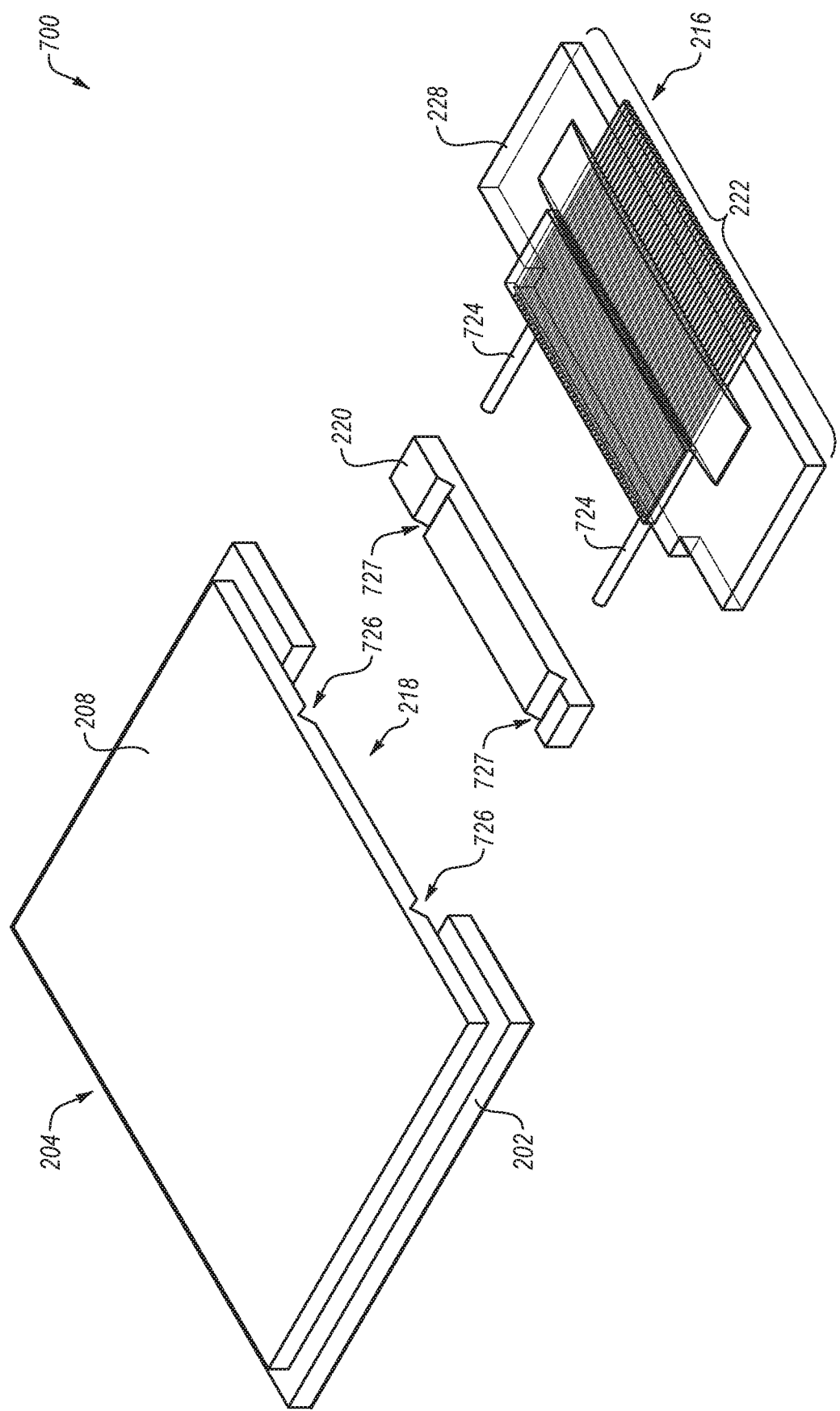
FIG. 7 is a perspective view of another example of an optoelectronic module.

FIG. 7 is a perspective view of another example of an optoelectronic module 700. The optoelectronic module 700 may include any suitable aspects described with respect to the optoelectronic module 200 of FIGS. 2A-2F and 3, and similar components are indicated with similar numbering.

As explained above, the optoelectronic module 200 may include alignment features for alignment. In FIGS. 2A-2F and 3, the optoelectronic module 200 includes the alignment features 224 on the optical connector 216 and the alignment features 226 on the interposer 202, although other configurations may be implemented. FIG. 7 illustrates another example configuration with alignment features 724 on the optical connector 216 and corresponding alignment features 726 on the interposer 202 and alignment features 727 on the AMC 220.

While the configuration of FIGS. 2A-2F and 3 includes alignment features 224, 226 on the optical connector 216 and the interposer 202, the configuration of FIG. 7 includes the alignment features 727 on the AMC 220 in addition to the alignment features 724 on the optical connector 216 and the alignment features 726 on the interposer 202. In such configurations, the alignment features 724 and the alignment features 726, 727 may permit the optical connector 216, the interposer 202, and the AMC 220 to be aligned and/or coupled to one another. In particular, the alignment features 724, 726, 727 may permit the optical connector 216 and/or the AMC 220 to be moved with respect to the interposer 202 in one direction (or vice versa, where the interposer 202 may be moved with respect to the optical connector 216 and/or the AMC 220), while restricting movement in other directions.

In the illustrated configuration, the alignment features 724 are pins (e.g., round pins) attached to the optical connector 216. The alignment features 726 are v-shaped grooves defined the body of the OIC 208 and the alignment features 727 are v-shaped grooves defined in the body of AMC 220. The v-shaped grooves may be sized and shaped to receive the pins thereby resulting in higher precision and better optical alignment of the components with respect to one another. As shown, the alignment features 726 on the interposer 202 may be oriented opposite or upside down with respect to the alignment features 727 on the AMC 220.

The alignment features 724 may be sized and shaped to extend through the alignment features 727 on the AMC 220 into the alignment features 726 on the interposer 202. Thus, the alignment features 724 are sized and shaped to mate with and be received in the alignment features 726, 727. However, this configuration is another example of mating alignment features. Any other suitable mating alignment features may be implemented on the optical connector 216, the interposer 202 and/or the AMC 220. The pin and groove configuration of the alignment feature 224, and alignment features 726, 727 may restrict movement in two directions (e.g., X and Y) while permitting movement in a third direction (e.g, Z). However, other configurations may be implemented that permit additional range of motion. For example, slots, rips or holes may be implemented to permit movement in two direction (e.g., Z and X) while restricting movement in one direction (e.g., Y). In some circumstances, the optoelectronic module 200 may be powered up to optically align the optical components to one another.

In one non-limiting example, an optoelectronic module may include a stack assembly including an electrical integrated circuit and an optical integrated circuit electrically and mechanically coupled to one another, an interposer electrically and mechanically coupled to the stack assembly, and an optical connector to optically couple the optical integrated circuit with an array of optical fibers.

The interposer may define a recess and the electrical integrated circuit of the stack assembly may be positioned at least partially within the recess. An adiabatic mode converter may be positioned between the optical connector and the interposer. The adiabatic mode converter may be positioned at least partially in a recess defined by the interposer. The recess may be sized and shaped to receive the adiabatic mode converter.

The interposer may include a first alignment feature that corresponds to a second alignment feature of the optical connector. The first alignment feature and the second alignment feature may restrict movement of the optical connector with respect to the interposer in two directions while permitting movement in a third direction.

The optoelectronic module may include an adiabatic mode converter positioned between the optical connector and the interposer, a first alignment feature included on the interposer, a second alignment feature included on the optical connector, and a third alignment feature on the adiabatic mode converter The first alignment feature, the second alignment feature, and third alignment feature may be configured to engage one another to align the interposer, the optical connector, and the adiabatic mode converter.

The electrical integrated circuit and the optical integrated circuit may be face to face bonded to one another. The stack assembly and the interposer may be flip-chip bonded to one another. The optical integrated circuit may be an integrated silicon photonic circuit. The stack assembly may be a silicon photonic stacked die.

A multiple chip module may include a substrate, a plurality of sockets positioned on the substrate. The optoelectronic module described herein may be positioned in one of the sockets. An integrated circuit may route electrical signals to the optoelectronic module.

In another example, a method may include face to face bonding an electrical integrated circuit and an optical integrated circuit to one another to form a stack assembly. The method may include flip-chip bonding the stack assembly to an interposer. The method may include optically coupling the optical integrated circuit with a fiber array via an optical connector. The method may include mechanically coupling the optical connector to the interposer.

The method may include positioning the optical integrated circuit in a recess defined by the interposer. The method may include positioning a portion of the optical connector in the recess defined by the interposer. The method may include positioning an adiabatic mode converter in a recess defined by the interposer. The adiabatic mode converter may be optically coupled between the optical integrated circuit and the optical connector. The method may include mating a first alignment feature of the optical connector with a second alignment feature of the interposer to align the optical connector with the interposer. The first alignment feature and the second alignment feature may restrict movement of the optical connector with respect to the interposer in two directions while permitting movement in a third direction.

The method may include mating a first alignment feature of the optical connector with a second alignment feature of the interposer and third alignment feature of an adiabatic mode converter, to align the optical connector with the adiabatic mode converter and the interposer.

Mechanically coupling the optical connector to the interposer may form an optoelectronic module, and the method may further include positioning the optoelectronic module in one of a plurality of sockets of a multiple chip module.

Unless specific arrangements described herein are mutually exclusive with one another, the various implementations described herein can be combined to enhance system functionality or to produce complementary functions. Likewise, aspects of the implementations may be implemented in standalone arrangements. Thus, the above description has been given by way of example only and modification in detail may be made within the scope of the present invention.

With respect to the use of substantially any plural or singular terms herein, those having skill in the art can translate from the plural to the singular or from the singular to the plural as is appropriate to the context or application. The various singular/plural permutations may be expressly set forth herein for sake of clarity. A reference to an element in the singular is not intended to mean "one and only one" unless specifically stated, but rather "one or more." Moreover, nothing disclosed herein is intended to be dedicated to the public regardless of whether such disclosure is explicitly recited in the above description.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that include A alone, B alone, C alone, A and B together, A and C together, B and C together, or A, B, and C together, etc.). Also, a phrase presenting two or more alternative terms, whether in the description, claims, or drawings, should be understood to include one of the terms, either of the terms, or both terms. For example, the phrase "A or B" will be understood to include the possibilities of "A" or "B" or "A and B." The present invention may be embodied in other specific forms without departing from its spirit or essential characteristics.

The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optoelectronic module, comprising:
   a stack assembly including an electrical integrated circuit and an optical integrated circuit electrically and mechanically coupled to one another, the optical integrated circuit comprising a first array of electrical couplings positioned around the electrical integrated circuit on a first face of the optical integrated circuit;
   an interposer electrically and mechanically coupled to the stack assembly via the first array of electrical couplings and a second array of electrical couplings positioned around a first recess formed in a first face of the interposer;
   an adiabatic mode converter positioned in a second recess defined in a side of the interposer, the first recess being separated from the second recess by a portion of the interposer underlying the second array of electrical couplings; and an optical connector positioned in the second recess and configured to optically couple the optical integrated circuit with an array of optical fibers, wherein the electrical integrated circuit extends at least partially within the first recess of the interposer.

2. The optoelectronic module of claim 1, wherein the first face of the optical integrated circuit and the first face of the interposer are adjacent with the first array of electrical couplings and the second array of electrical couplings in between.

3. The optoelectronic module of claim 1, wherein the adiabatic mode converter is positioned between the optical connector and the interposer.

4. The optoelectronic module of claim 1, wherein the interposer includes a first alignment feature that corresponds to a second alignment feature of the optical connector.

5. The optoelectronic module of claim 4, wherein the first alignment feature and the second alignment feature restrict movement of the optical connector with respect to the interposer in two directions while permitting movement in a third direction.

6. The optoelectronic module of claim 1, further comprising:
a first alignment feature included on the interposer;
a second alignment feature included on the optical connector; and
a third alignment feature on the adiabatic mode converter,
wherein the first alignment feature, the second alignment feature, and third alignment feature are configured to engage one another to align the interposer, the optical connector, and the adiabatic mode converter.

7. The optoelectronic module of claim 1, wherein the electrical integrated circuit and the optical integrated circuit are face-to-face bonded to one another.

8. The optoelectronic module of claim 1, wherein the stack assembly and the interposer are flip-chip bonded to one another.

9. The optoelectronic module of claim 1, wherein the optical integrated circuit is an integrated silicon photonic circuit.

10. The optoelectronic module of claim 1, wherein the stack assembly is a silicon photonic stacked die.

11. A multiple chip module comprising:
a substrate;
a plurality of sockets positioned on the substrate, the optoelectronic module of claim 1 positioned in one of the sockets; and
an integrated circuit to route electrical signals to the optoelectronic module.

12. The optoelectronic module of claim 1, wherein the adiabatic mode converter comprises an alignment feature configured to align the interposer, the optical connector, and the adiabatic mode converter.

13. The optoelectronic module of claim 1, wherein the adiabatic mode converter is positioned against the optical integrated circuit.

14. The optoelectronic module of claim 1, the second recess is sized and shaped to receive an entirety of the adiabatic mode converter.

15. An optoelectronic module, comprising:
an optical integrated circuit comprising a first array of electrical couplings on a first face of the optical integrated circuit;
an interposer coupled to the optical integrated circuit via the first array of electrical couplings and a second array of electrical couplings positioned around a first recess formed in a first face of the interposer;
an adiabatic mode converter positioned within a second recess defined in a side of the interposer, the first recess being separated from the second recess by a portion of the interposer underlying the second array of electrical couplings; and
an optical connector positioned in the second recess adjacent to the adiabatic mode converter,
wherein the first face of the optical integrated circuit and the first face of the interposer are adjacent with the first array of electrical couplings and the second array of electrical couplings in between.

16. The optoelectronic module of claim 15, further comprising an electrical integrated circuit electrically coupled to the optical integrated circuit,
wherein the electrical integrated circuit is positioned at least particularly within the first recess formed in the first face of the interposer.

17. The optoelectronic module of claim 16,
wherein the electrical integrated circuit and the optical integrated circuit are face-to-face bonded to one another to form a stack assembly, and
wherein the stack assembly and the interposer are flip-chip bonded to one another.

18. The optoelectronic module of claim 15, the second recess is sized and shaped to receive an entirety of the adiabatic mode converter.

19. An optoelectronic module, comprising:
a stack assembly including an electrical integrated circuit and an optical integrated circuit face-to-face bonded to one another;
an interposer flip-chip bonded to the stack assembly via a first array of electrical couplings positioned on a first face of the optical integrated circuit and a second array of electrical couplings positioned on a first face of the interposer, the electrical integrated circuit being positioned to extend at least partially within a first recess formed in the first face of the interposer;
an adiabatic mode converter positioned in a second recess defined in a side of the interposer; and
an optical connector having at least a portion positioned in the second recess defined in the side of the interposer,
wherein the first recess is separated from the second recess by a portion of the interposer underlying the second array of electrical couplings.

20. The optoelectronic module of claim 19, wherein the adiabatic mode converter is positioned against the optical integrated circuit.

21. The optoelectronic module of claim 19, wherein the second recess is sized and shaped to receive an entirety of the adiabatic mode converter.

* * * * *